US007078925B2

(12) United States Patent
Long

(10) Patent No.: US 7,078,925 B2
(45) Date of Patent: Jul. 18, 2006

(54) METHOD AND APPARATUS FOR DETECTING AND CORRECTING WIRING ERRORS IN POWER MONITORING APPLICATIONS

(75) Inventor: Avery Long, Symrna, TN (US)

(73) Assignee: Square D Company, Palatine, IL (US)

( * ) Notice: Subject to any disclaimer, the term of this patent is extended or adjusted under 35 U.S.C. 154(b) by 267 days.

(21) Appl. No.: 10/385,962

(22) Filed: Mar. 11, 2003

(65) Prior Publication Data

US 2004/0181718 A1  Sep. 16, 2004

(51) Int. Cl.
*G01R 31/26* (2006.01)

(52) U.S. Cl. .................. 324/765; 324/158.1; 324/772; 324/142

(58) Field of Classification Search ............... 324/142, 324/107; 702/61, 60, 99, 57, 130–132; 320/870.02, 320/870.17, 870.25, 870.26; 374/170, 171, 374/101
See application file for complete search history.

(56) References Cited

U.S. PATENT DOCUMENTS

| | | | |
|---|---|---|---|
| 4,672,555 A | 6/1987 | Hart et al. .................. | 364/483 |
| 4,803,635 A | 2/1989 | Andow ....................... | 364/483 |
| 5,086,292 A | 2/1992 | Johnson et al. ............. | 340/637 |
| 5,168,459 A | 12/1992 | Hiller ..................... | 364/724.19 |
| 5,652,505 A | 7/1997 | Brune ........................ | 324/107 |
| 6,112,158 A | 8/2000 | Bond et al. .................. | 702/61 |
| 6,377,037 B1 * | 4/2002 | Burns et al. ................. | 324/142 |
| 6,618,684 B1 * | 9/2003 | Beroset et al. ................ | 702/99 |

FOREIGN PATENT DOCUMENTS

| | | |
|---|---|---|
| EP | 0 685 744 | 5/1995 |
| GB | 1 575 148 | 9/1980 |

OTHER PUBLICATIONS

"Powerlogic® Advanced Power Reliability Solutions," Square D Schneider Electric, brochure, 2000, 3 pages.
"Powerlogic® Circuit Monitor—Series 2000," Class 3020, Square D Schneider Electric, brochure, 3 pages.
"Powerlogic® Power Meter," Class 3020, Square D Schneider Electric, brochure, 1998, 2 pages.
"Powerlogic® Metering & Monitoring Devices," Square D Schneider Electric, brochure, 2000, 2 pages.
"Powerlogic® Power Monitoring and Control System," Square D Schneider Electric, brochure, 1998, 4 pages.
"Powerlogic® Series 4000 Circuit Monitor," Square D Schneider Electric, brochure, 2000, 3 pages.
"Powerlogic® System Architecture and Application Guide," Data Bulletin, Square D Schneider Electric, May 2000.

(Continued)

*Primary Examiner*—Vinh Nguyen
*Assistant Examiner*—Jimmy Nguyen

(57) ABSTRACT

A three-phase monitoring system for detecting and dynamically correcting wiring errors in an electrical circuit. The system includes a voltage divider circuit and a current transformer circuit connected to three voltage channels and three current channels, respectively. Samples of the voltages and currents are held in respective sample and hold circuits, which are provided to an analog multiplexer. The analog multiplexer is controlled by a processor, and is coupled to gain and filter circuitry, sample and hold circuitry, and to an analog-to-digital converter (ADC). The ADC is connected to the processor, which analyzes the power factor for a given voltage/current pair. If the power factor is outside of an expected range, the processor dynamically changes the addresses assigned to the channels such that the data arrives in the processor in an expected sequence.

26 Claims, 3 Drawing Sheets

OTHER PUBLICATIONS

Communication Relating to the Results of the Partial International Search for International Application No. PCT/US2004/007030; 2 pages; dated Aug. 23, 2004.

PCT International Search Report for International Application No. PCT/US2004/007030; 6 pages; dated Oct. 20, 2004.

* cited by examiner

METHOD AND APPARATUS FOR DETECTING AND CORRECTING WIRING ERRORS IN POWER MONITORING APPLICATIONS

FIELD OF THE INVENTION

This invention is directed generally to power monitoring, and more particularly to detecting and correcting wiring errors in power monitoring applications using hardware-based dynamic conversion means.

BACKGROUND OF THE INVENTION

Power monitoring systems monitor the flow of electrical power in circuits through a plant or other facility. In the POWERLOGIC® system manufactured by the instant assignee, Square D Company, circuit monitors and power meters are dedicated to power monitoring, while other compatible devices collect additional equipment information from protective relays, circuit breakers, transformer temperature controllers, and panelboards. Electrical data, such as current, power, energy, waveforms, and equipment status, is passed over a data network to one or more personal computers. The personal computers run power monitoring application software that retrieves, stores, organizes, and displays real-time circuit information in simple, usable formats. The information collected and stored in a power monitoring system helps operate a facility more efficiently. The quality of the data depends upon the accuracy of the instrumentation and the usability of the display formats.

The power meter can replace conventional metering devices such as ammeters, voltmeters, and watt-hour meters while providing other capabilities not offered by analog metering. The power meter's true rms readings reflect non-linear circuit loading more accurately than conventional analog metering devices. The power meter calculates the neutral current, which can assist in identifying overloaded neutrals due to either unbalanced single phase loads or harmonics. Circuits can be closely monitored for available capacity by keeping track of the peak average demand current.

Permanently installed electrical monitoring equipment is typically installed during a plant shut-down which may only happen once or twice a year. One or more metering devices are typically installed during these shutdowns. Upon re-energizing the electrical distribution equipment in the facility some wiring errors may be found that cannot be corrected until the next shut-down due to cost of taking manufacturing down to correct for these errors. In poly-phase systems, common wiring errors include swapping phases on the voltage and current channels or wiring current phases backwards. For example, the installer may mistakenly connect the phase B voltage line to the phase C voltage line on a meter. Due to the differences in electrical connectors typically used, interchanging current and voltage lines is normally not encountered.

In somewhat more sophisticated or higher-end monitoring systems, a microprocessor-based control system is utilized. In such systems, phase wiring errors may be corrected using software. However, this solution requires more microprocessor processing time as well as at least double the memory requirement. That is, buffers or registers used to take in the raw data from the metering points or monitor input would have to be duplicated by a second buffer or register, in each instance, to transfer the corrected data points under control of the processor. In lower-end metering applications, there is either insufficient processing power, insufficient memory, or both to correct phase wiring errors through software alone. Moreover, the analog circuitry which processes and digitizes the incoming signals is space-consuming.

Therefore, a need exists for a system and method for detecting and correcting wiring errors without having to shut-down the system and without burdening the processor with memory-intensive operations. A need also exists for a power-monitoring system having a reduced circuit board footprint. The present invention satisfies this and other needs.

SUMMARY OF THE INVENTION

Briefly, in accordance with the foregoing, a power-monitoring system that detects and dynamically corrects a wiring error in a poly-phase electrical circuit includes inputs adapted to receive power signals to be monitored, a processor having data inputs, a correction circuit including an analog multiplexer having inputs coupled to receive the power signals, having outputs coupled to said the inputs of the processor, and having a control input coupled to the processor, and the processor having a control output coupled with the control input to cause representative ones of the power signals to be provided from the outputs of the analog multiplexer to the data inputs of the processor in a determined sequence.

A method for detecting a wiring error in an electrical circuit monitored by a power-monitoring system includes addressing an analog multiplexer under control of a processor to select a first input carrying an analog voltage signal from the electrical circuit monitored by the power-monitoring system, addressing the analog multiplexer to select a second input carrying an analog current signal corresponding to the analog voltage signal, calculating the power factor corresponding to the analog voltage signal and the analog current signal, and comparing the power factor with an expected power factor range.

The above summary of the present invention is not intended to represent each embodiment, or every aspect, of the present invention. This is the purpose of the figures and the detailed description which follow.

BRIEF DESCRIPTION OF THE DRAWINGS

The foregoing and other advantages of the invention will become apparent upon reading the following detailed description and upon reference to the drawings.

Figure 1:
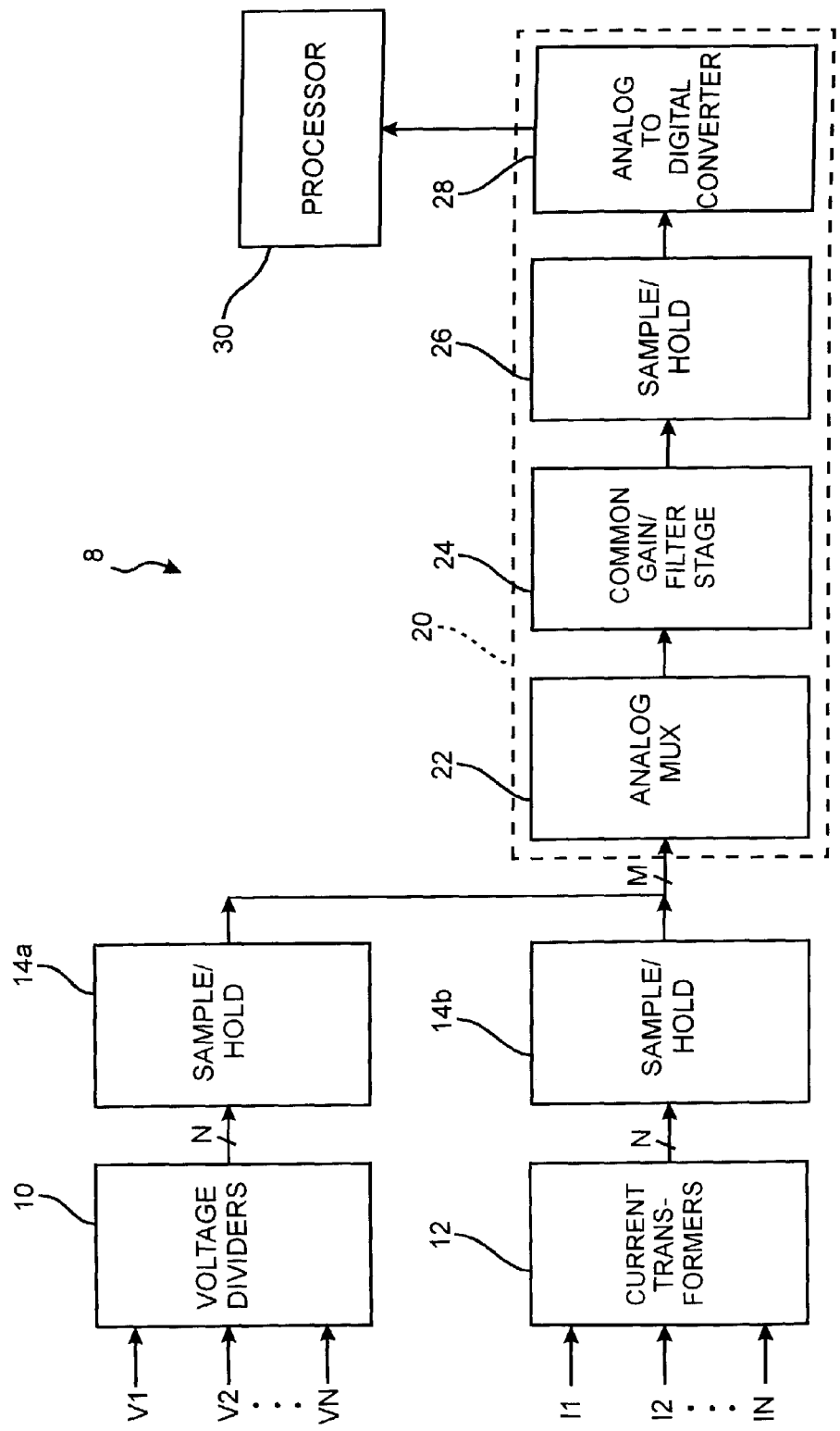
FIG. 1 is a functional block diagram of a poly-phase monitoring system.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENT

The present invention detects and corrects for wiring errors without requiring the electrical equipment to be powered down and rewired. There are at least two common wiring errors that operators can make when connecting electrical equipment to power monitors. One wiring error involves swapping the phases on the current or voltage lines, such as connecting the phase A current line to the phase B current line. When this wiring error occurs, the displacement angles of the respective phases appear in the wrong quadrant. Another wiring error involves wiring up a current phase backwards, such that the current flows backwards with respect to its corresponding voltage phase.

Generally speaking, in a three-phase system, typical power monitors provide one connection or metering point each for each of the three voltage and current phases, for a total of six connection points. Heretofore, basic metering devices would yield incorrect readings if the wrong phase is connected to the wrong input, for example, if the phase-B current line is physically connected to the phase-A current line. In such systems, the only way in which to correct the error is to shut down the system and rewire the metering points as noted above.

Referring to the drawings and initially to FIG. 1, there is shown the data paths and principal components of a polyphase monitoring system 8 in accordance with an embodiment of the present invention. The system 8 generally includes voltage dividers 10, current transformers 12, sample and hold circuits 14a,b, a correction circuit 20, and a processor 30. The correction circuit 20 includes a multi-channel analog multiplexer 22, a common gain/filter stage 24, a sample and hold circuit 26, and an analog-to-digital converter 28 (ADC).

N voltage lines and N current lines corresponding to 2N lines to be monitored are connected to the voltage dividers 10 and the current transformers 12. As is known, the voltage dividers 10 and current transformers 12 operate to reduce the magnitude of the incoming voltage and current, respectively, to levels appropriate for the sample and hold circuits 14a,b.

The voltage dividers 10 and the current transformer 12 are connected to N-way sample and hold circuits 14a and 14b, respectively. The processor 30 simultaneously strobes each of the sample and hold circuits 14a,b in order to obtain voltage and current samples of each input and to preserve the relative phase relationship of all inputs of the sample and hold circuits 14a,b.

In the correction circuit 20, the analog multiplexer 22 selects one of the N voltage or current channels for analysis from at least 2N or M number of channels. In a specific embodiment, the analog multiplexer 22 is an 8-channel multiplexer. An optional neutral line (not shown) may also be monitored by the system 8 and coupled to the analog multiplexer 22. Thus, in a three-phase system, 7 channels of the analog multiplexer 22 would be used; 3 for each of the 3 voltage channels, 3 for each of the 3 current channels, and one for neutral. Note that in other embodiments, a different number of channels may be multiplexed by the analog multiplexer 22, which may have fewer or more than 8 channels.

The selected channel is provided to the gain/filter stage 24 and the sample and hold circuit 26 and the resulting signal is converted to a representative digital signal by the ADC 28. In an embodiment, the ADC 28 is a 12-bit converter. The converted digitized input is provided to the microprocessor for analysis. While a multi-channel ADC could be used instead of the analog multiplexer 22, the conversion order would be fixed and there would only be a one-to-one mapping of the voltage and current channels. In contrast, the present invention utilizes the sample and hold circuits 14a and 14b in conjunction with the multi-channel analog multiplexer 22 to dynamically change the conversion order of the channels by changing the successive addresses assigned to the analog multiplexer 22 after the sample and hold circuits 14 have latched the channels, such that the data is always provided to the processor in an expected order.

The analog multiplexer 22 is controlled through software executed by the processor 30, which also controls the conversion order of the ADC 28 to correct for any wiring errors without requiring the system 8 to be rewired. Any wiring errors will be detected by defaulting the conversion sequence to VA, VB, VC, IA, IB, IC or the order expected when the wiring is correct.

The correction circuit 20 may contain discrete elements or in other embodiments may be implemented in an integrated circuit such as the ADC12048 commercially available from National Semiconductor. The integrated circuit replaces numerous analog components, which reduces complexity and circuit-board real estate.

Figure 2:
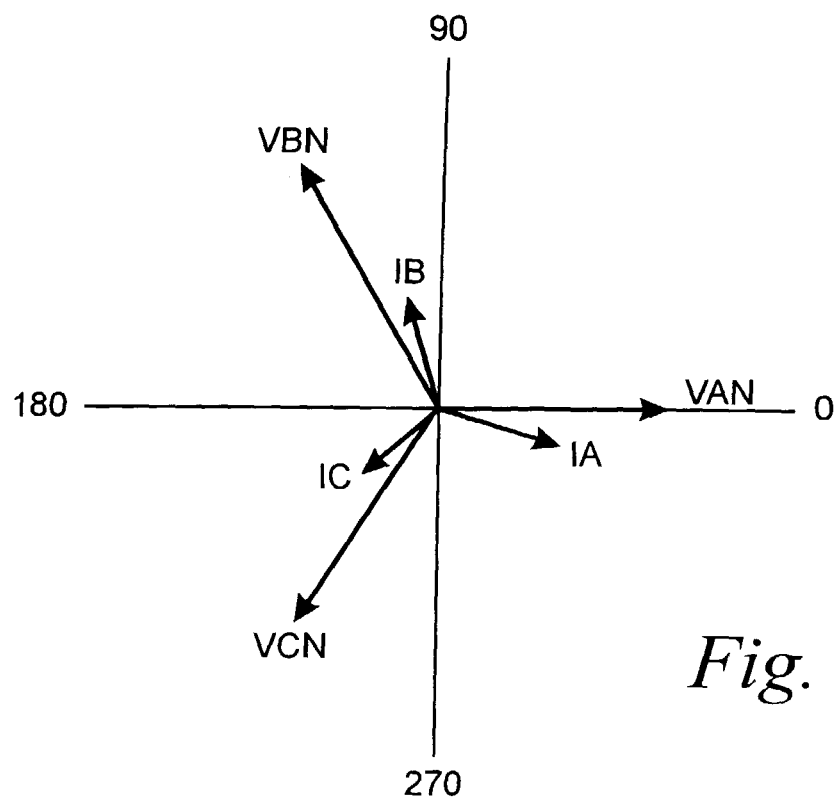
FIG. 2 is a vector diagram of a three-phase power load with all phases in their correct relationship.

FIG. 2 is a vector diagram of an exemplary three-phase power load with the voltage phases VA, VB, and VC shown in proper phase relationship with their corresponding current phases IA, IB, and IC. The power computation of a polyphase circuit is obtained by determining the power factor using a Fast Fourier Transform of each pair, i.e., VA/IA, VB/IB and VC/IC. The expected power factor associated with each phase is assumed to be within certain bounds, normally about 0.5 leading or about 0.8 leading to about 0.5 lagging. When the phases have been wired up incorrectly, one of at least two things can occur. First, one or more of their associated displacement angles appear in the wrong quadrants. Thus, when two voltage lines are swapped, the voltage phase appears 120 degrees out of the expected range. Second, current appears to flow backwards with respect to the voltage in the same phase. Thus, when a current line is wired up backwards, the phase for the current appears 180 degrees out of the expected range. To correct a current phase wired up backwards, the processor 30 is instructed to multiply the value corresponding to the current on the incorrectly wired up phase by −1.

Figure 3:
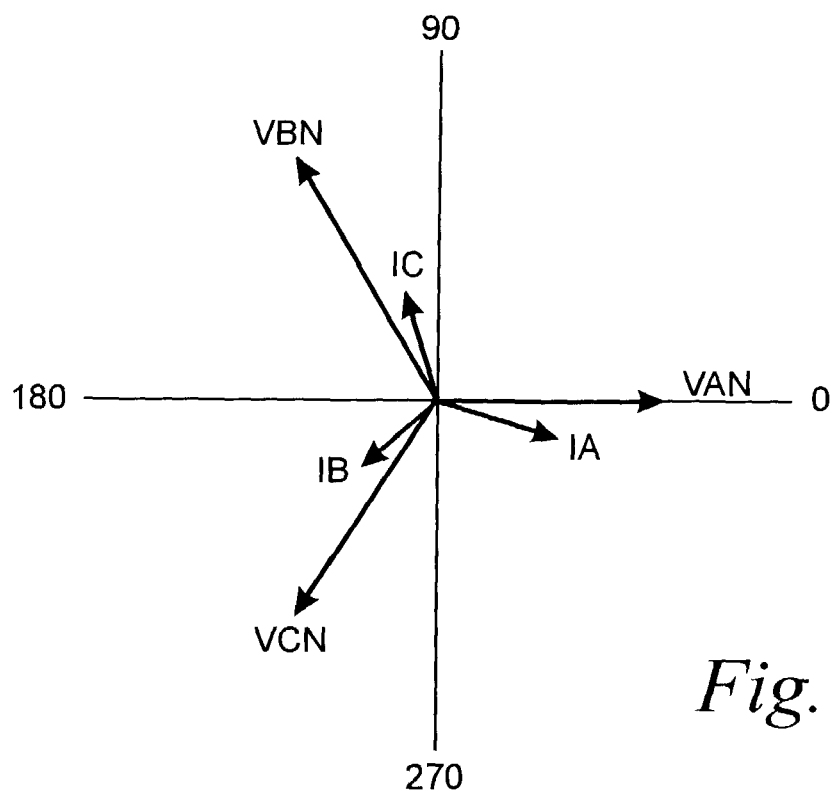
FIG. 3 is a vector diagram of a three-phase power load with two current phases, IB and IC, switched.

FIG. 3 is a vector diagram of a three-phase power load with two current lines, IB and IC, inadvertently switched, i.e., the operator connected the phase-B current line to the phase-C current line. After performing a Fourier transform and analyzing the phase fundamentals of each phase, the processor 30 can determine that the operator has inadvertently switched the IB and IC lines. According to the present invention, for any wiring error in which phases are swapped (such as IB and IC swapped), the A/D conversion sequence for the power factor computation of each voltage/current pair is changed to VA/IA, VB/IC and VC/IB. The analog multiplexer 22, under control of the processor 30, switches the addresses of the incorrectly wired channels so that they appear to the processor 30 in the proper and expected order. The system 8 may inform the operator that a wiring error has been detected and the type of wiring error so that the phases can be wired up correctly during the next planned system shutdown. The present invention avoids costly unplanned system shutdowns to correct wiring errors, and does not require substantial processor bandwidth or expanded memory allocation.

Figure 4:
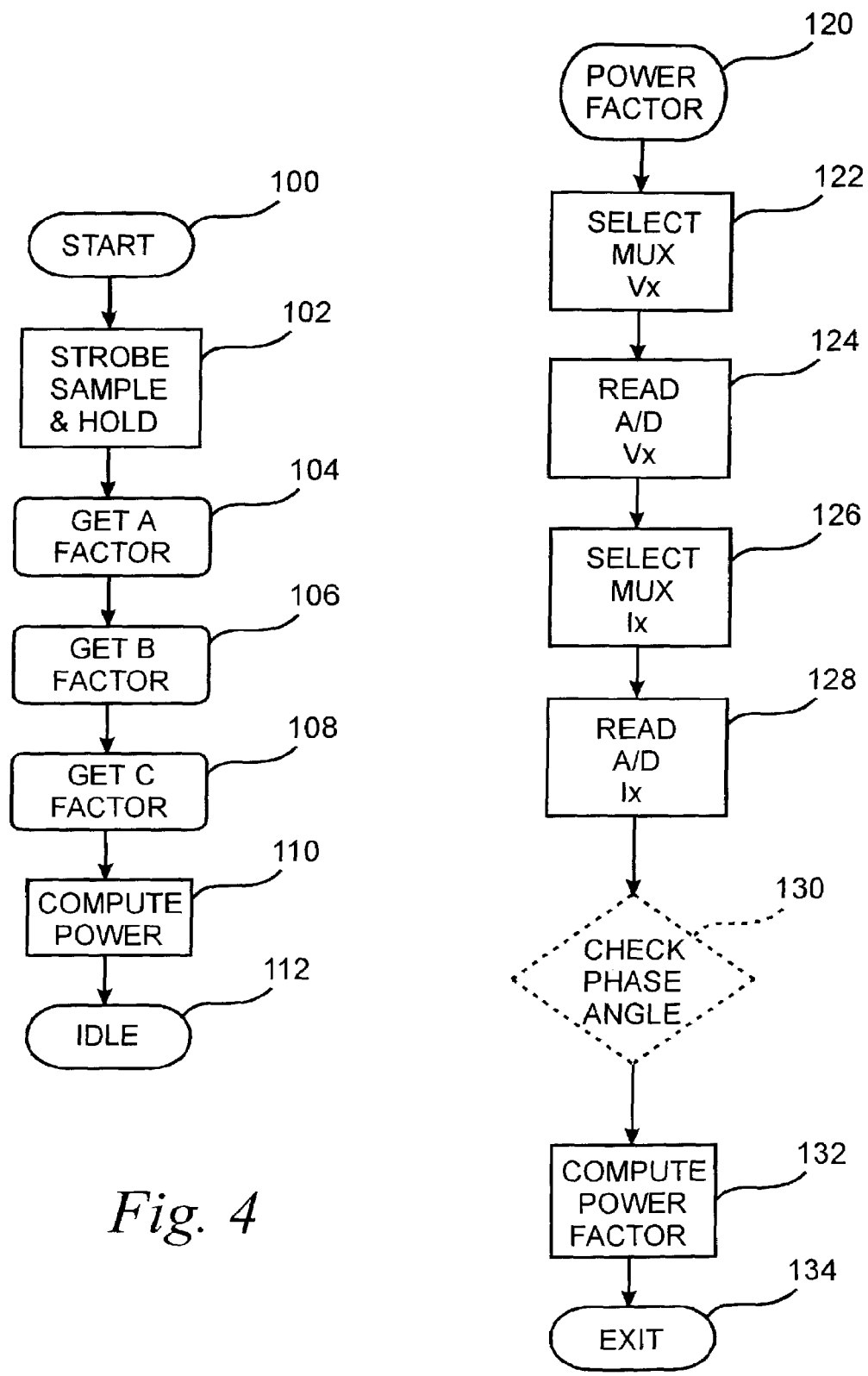
FIG. 4 is a flow chart diagram of the steps to obtain a power reading from a three-phase power circuit, in accordance with a specific embodiment of the present invention.

FIG. 4 depicts a flowchart for obtaining a power reading on a three-phase (A, B, C) power circuit using the system 8 shown in FIG. 1. The main routine is entered at step 100 which may occur by command or by a timer. At step 102, the N-way sample and hold circuits 14a and 14b are strobed by the processor 30 to obtain a snapshot of the voltage and current readings of the signals present in the voltage dividers 10 and the current transformers 12 at a specific instant of time.

At step 104, the power factor for phase A is determined by calling the power factor subroutine, steps 120–134, which is described in more detail below. The power factor subroutine returns the power factor for phase A, which may be stored in a memory location. This power factor A corresponds to the power factor for the voltage/current channel pairs from the voltage dividers 10 and the current transformers 12, i.e., V1/I1.

At step 106, the power factor for phase B is determined in a similar manner, except that the parameter B is passed as an argument to the power factor subroutine. The power factor B may also be stored in a memory location, and corresponds to the power factor for V2/I2.

At step 108, the power factor for phase C is determined by passing the parameter C to the power factor subroutine. The power factor C may be stored in a memory location, and corresponds to the power factor for V3/I3.

At step 110 the power of the three-phase circuit is calculated using the computed power factors for phases A, B, and C. In an embodiment, the routine is idled at step 112 until a timer restarts the cycle at step 100. In an alternate embodiment, the routine continually cycles, passing control from step 112 to step 100.

The power factor subroutine is initiated at step 120, and receives as parameters the addresses of the voltage/current pair (e.g., the address of V1 and the address of I1) to be analyzed. In one embodiment, the system 8 has already determined that one or more wiring errors has occurred, and instructs the multiplexer 22 to adjust the addresses so that the readings are made in the proper order. In another embodiment, such as at power-up after the system 8 has been wired up, the system 8 has not yet determined whether a wiring error has occurred, and must therefore check the phase-angle relationships of each voltage/current pair to determine whether an adjustment in the analog multiplexer 28 is necessary. In yet another embodiment, the system 8 periodically or at predetermined intervals checks the phase relationships to verify they are not outside of expected ranges.

At step 122, the analog multiplexer 22 selects the address of the voltage line V1-VN corresponding to the phase parameter to be analyzed. For example, to analyze phase B, the address corresponding to voltage line V2 is selected by the multiplexer 22 under command of the processor 30. If a wiring error has been previously detected, a different address may be selected. For example, if V1 and V2 were reversed, the address of V2 actually corresponds to the voltage line V1. In such a case, the processor 30 would instruct the multiplexer 22 to select the address corresponding to voltage line V1 in order to compute the power factor for phase B.

As described in connection with FIG. 1, the multiplexer 22 receives the signal corresponding to the voltage channel held by the sample and hold circuit 14a and provides the resulting signal to the gain/filter stage 24. The amplified signal is sampled by the sample and hold circuit 26 and digitized by the ADC 28. The digital signal is provided to the processor 30 in step 124. The resulting voltage sample may be stored in a memory location.

Similarly, at step 126 the processor 30 instructs the analog multiplexer 22 to select the address of the current line I1-IN corresponding to the phase parameter to be analyzed. The analog multiplexer 28 reads the current channel corresponding to the phase to be analyzed from the sample and hold circuit 14b, and provides that signal to the gain/filter stage 24. The resulting signal is amplified and digitized by the ADC 28 and provided to the processor 30 in step 128. The resulting current sample may be stored in a memory location.

The processor 30 applies a Fast Fourier Transform algorithm on the voltage and current samples to obtain their phase angles. At step 130, the processor optionally checks the relationship of the phase angles. As noted above, the expected power factor on each phase is assumed to be within certain bounds, normally about 0.5 leading or about 0.8 leading to about 0.5 lagging. If the relationship is outside of an expected range, then a wiring error or other circuit failure may be indicated.

In the preceding description, the addresses of the voltage/current pairs is assumed and those addresses are passed to the power factor routine steps 120–134 as arguments. In the case of a wiring error, the error can be detected at optional step 130 and a new current line address I1-IN can be tried until a reading is obtained indicating a proper phase relationship. In such a case, the addresses of the voltage/current pairs are modified such that the voltage/current phases are in their proper relationship. For example, in the wiring error described in connection with FIG. 3, steps 104, 106, 108 would call the power factor routine with the voltage/current address arguments of V1/I1, V2/I3 and V3/I2 respectively. In this manner, although the I2 and I3 lines are swapped, the data nonetheless arrives in the memory map in the expected sequence. The power factor subroutine is exited at step 134.

The invention generally may be used in meters or other devices which monitor electricity or quantities with known phase relationships such as power systems. The invention offers greater flexibility in auto configuration or self correction for wiring errors without causing downtime to the end user. While a 3-phase power system has been described herein, it is understood that the system 8 can be extended to any number of inputs which have fixed phase relationships.

As indicated above, the invention may have other uses or advantages as well. For example, rather than correcting for incorrect wiring sequences, the invention may be used to automatically configure any given wire sequence to a desired input sequence and any type of metering or monitoring situation where the quantities to be monitored have known phase or relationships which can be detected by the monitoring process. In addition, the invention advantageously can solve for problems of coupling between channels.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A power-monitoring system that detects and dynamically corrects a wiring error in a poly-phase electrical circuit, comprising:
   a plurality of inputs adapted to receive power signals to be monitored;
   a processor having data inputs;
   a correction circuit including an analog multiplexer having inputs coupled to receive said power signals in a first sequence, having outputs coupled to said data inputs of said processor, and having a control input coupled to said processor; and
   said processor having a control output coupled with said control input and programmed to cause representative ones of said power signals to be provided from said outputs of said analog multiplexer to said data inputs of said processor in a determined sequence that differs from said first sequence when at least one wiring error is detected.

2. The system of claim 1, wherein said correction circuit further includes an analog-to-digital converter coupled between said outputs of said analog multiplexer and said data inputs of said processor.

3. The system of claim 2, wherein said correction circuit further includes a gain/filter circuit coupled between said outputs of said analog multiplexer and said analog-to-digital converter.

4. The system of claim 2, wherein said correction circuit further includes a sample and hold circuit coupled between said outputs of said analog multiplexer and said data inputs of said processor.

5. The system of claim 1 and further including at least one sample and hold circuit coupled between said plurality of inputs and said correction circuit.

6. The system of claim 1, wherein said correction circuit is an integrated circuit.

7. The system of claim 1, further including a memory storing executable instructions for comparing a characteristic associated with said power signals to be monitored against an expected quantity, said memory coupled to said processor.

8. The system of claim 7, wherein said characteristic is a power factor.

9. The system of claim 1, further including a memory coupled to said processor, said memory storing executable instructions for dynamically changing the address of said analog multiplexer upon detection of a wiring error.

10. The system of claim 1, further including a memory coupled to said processor, said memory storing instructions executed by said processor, said instructions controlling said analog multiplexer via said control input to cause said data inputs of said processor to receive representative ones of said power signals to be monitored in said determined sequence.

11. The system of claim 1, wherein said power signals to be monitored include voltage signals and current signals.

12. The system of claim 1, further including a memory coupled to said processor, said memory storing values corresponding to digitized representations of said power signals to be monitored in said determined sequence.

13. The system of claim 12, wherein said memory is integrated into said processor.

14. The system of claim 1, wherein said power signals are carried in a plurality of voltage lines and a plurality of current lines.

15. A power-monitoring system for monitoring power signals having known phase relationships, comprising:
a plurality of inputs adapted to receive power signals corresponding to electrical characteristics to be monitored;
a multi-channel analog multiplexer having multiplexer inputs and control inputs, said control inputs being addressable to select one of said multiplexer inputs, said multiplexer inputs receiving a representative sample of the signal in a selected one of said multiplexer inputs, said analog multiplexer further having multiplexer outputs outputting the selected one of said multiplexer inputs;
an analog-to-digital converter receiving the output from said multiplexer outputs and converting the output to a digital signal;
a processor coupled to said analog-to-digital converter and receiving said digital signal, said processor having a control output coupled with said control input of said analog multiplexer to address a selected one of said plurality of inputs, said processor being programmed with instructions to detect at least one wiring error and, based upon such detection, automatically alter its addressing of said analog multiplexer from a sequence to a determined sequence; and
a memory for storing said instructions.

16. The system of claim 15, wherein said analog multiplexer and said analog-to-digital converter form an integrated circuit.

17. The system of claim 16, wherein said integrated circuit further includes a filter/gain circuit coupled to said analog multiplexer and a sample and hold circuit coupled between said filter/gain circuit and said analog-to-digital converter.

18. The system of claim 15, further including a plurality of sample and hold circuits, one for each input, coupled to said analog multiplexer.

19. The system of claim 18, wherein said analog signals include voltage signals and current signals, and further including a voltage divider circuit and a current transformer circuit coupled to said plurality of sample and hold circuits.

20. The system of claim 15, wherein said electrical characteristics to be monitored include voltage and current.

21. A power-monitoring system that detects and dynamically corrects a wiring error in a poly-phase electrical circuit, comprising:
a plurality of inputs adapted to receive power signals to be monitored;
a processor having data inputs; and
a correction circuit including an analog multiplexer having inputs coupled to receive said power signals, having outputs coupled to said data inputs of said processor, and having a control input coupled to said processor,
said processor having a control output coupled with said control input to cause representative ones of said power signals to be provided from said outputs of said analog multiplexer to said data inputs of said processor in a determined sequence, and said processor being programmed to dynamically change the address of said analog multiplexer upon detection of a wiring error.

22. The system of claim 21, wherein said correction circuit further includes an analog-to-digital converter coupled between said outputs of said analog multiplexer and said data inputs of said processor.

23. The system of claim 22, wherein said correction circuit further includes a gain/filter circuit coupled between said outputs of said analog multiplexer and said analog-to-digital converter.

24. The system of claim 22, wherein said correction circuit further includes a sample and hold circuit coupled between said outputs of said analog multiplexer and said data inputs of said processor.

25. The system of claim 21 and further including at least one sample and hold circuit coupled between said plurality of inputs and said correction circuit.

26. The system of claim 21, further including a memory coupled to said processor, said memory storing executable instructions for dynamically changing the address of said analog multiplexer upon detection of a wiring error.

* * * * *